(12) United States Patent
Chae

(10) Patent No.: US 8,743,604 B2
(45) Date of Patent: Jun. 3, 2014

(54) NONVOLATILE MEMORY DEVICES HAVING IMPROVED READ RELIABILITY

(75) Inventor: Donghyuk Chae, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 352 days.

(21) Appl. No.: 13/009,979

(22) Filed: Jan. 20, 2011

(65) Prior Publication Data

US 2011/0194347 A1 Aug. 11, 2011

(30) Foreign Application Priority Data

Feb. 8, 2010 (KR) ........................ 10-2010-0011553

(51) Int. Cl.
*G11C 11/34* (2006.01)

(52) U.S. Cl.
USPC ............ 365/185.03; 365/185.17; 365/185.24; 365/189.05; 365/189.17

(58) Field of Classification Search
CPC ............... G11C 11/5642; G11C 16/26; G11C 16/0483; G11C 2211/5646
USPC ............. 365/185.03, 185.17, 185.24, 189.05, 365/189.17
See application file for complete search history.

(56) References Cited

U.S. PATENT DOCUMENTS

| 6,858,906 | B2 | 2/2005 | Lee et al. |
|---|---|---|---|
| 7,493,457 | B2 | 2/2009 | Murin |
| 7,529,124 | B2 | 5/2009 | Cho et al. |
| 2004/0169238 | A1 | 9/2004 | Lee et al. |
| 2006/0180851 | A1 | 8/2006 | Lee et al. |
| 2007/0109854 | A1* | 5/2007 | Shibata ................... 365/185.08 |
| 2008/0023747 | A1 | 1/2008 | Park et al. |
| 2008/0062758 | A1* | 3/2008 | Honma et al. ................ 365/184 |
| 2008/0084729 | A1 | 4/2008 | Cho et al. |
| 2009/0225596 | A1 | 9/2009 | Shin et al. |
| 2010/0124088 | A1* | 5/2010 | Shalvi et al. .................... 365/45 |
| 2011/0205805 | A1* | 8/2011 | Honma et al. ........... 365/185.22 |

FOREIGN PATENT DOCUMENTS

| JP | 2000-298992 | 10/2000 |
|---|---|---|
| KR | 100673020 B1 | 1/2007 |
| KR | 1020070087557 A | 8/2007 |
| KR | 1020090097107 A | 9/2009 |

* cited by examiner

*Primary Examiner* — Thao H Bui

(74) *Attorney, Agent, or Firm* — Stanzione & Kim, LLP

(57) ABSTRACT

Memory systems include at least one nonvolatile memory array having a plurality of rows of nonvolatile multi-bit (e.g., N-bit, where N>2) memory cells therein. A control circuit is also provided, which is electrically coupled to the nonvolatile memory array. The control circuit is configured to program at least two pages of data into a first row of nonvolatile multi-bit memory cells in the nonvolatile memory array using a first sequence of read voltages to verify accuracy of the data stored within the first row. The control circuit is also configured to read the at least two pages of data from the first row using a second sequence of read voltages that is different from the first sequence of read voltages. Each of the read voltages in the first sequence of read voltages may be equivalent in magnitude to a corresponding read voltage in the second sequence of read voltages.

15 Claims, 12 Drawing Sheets

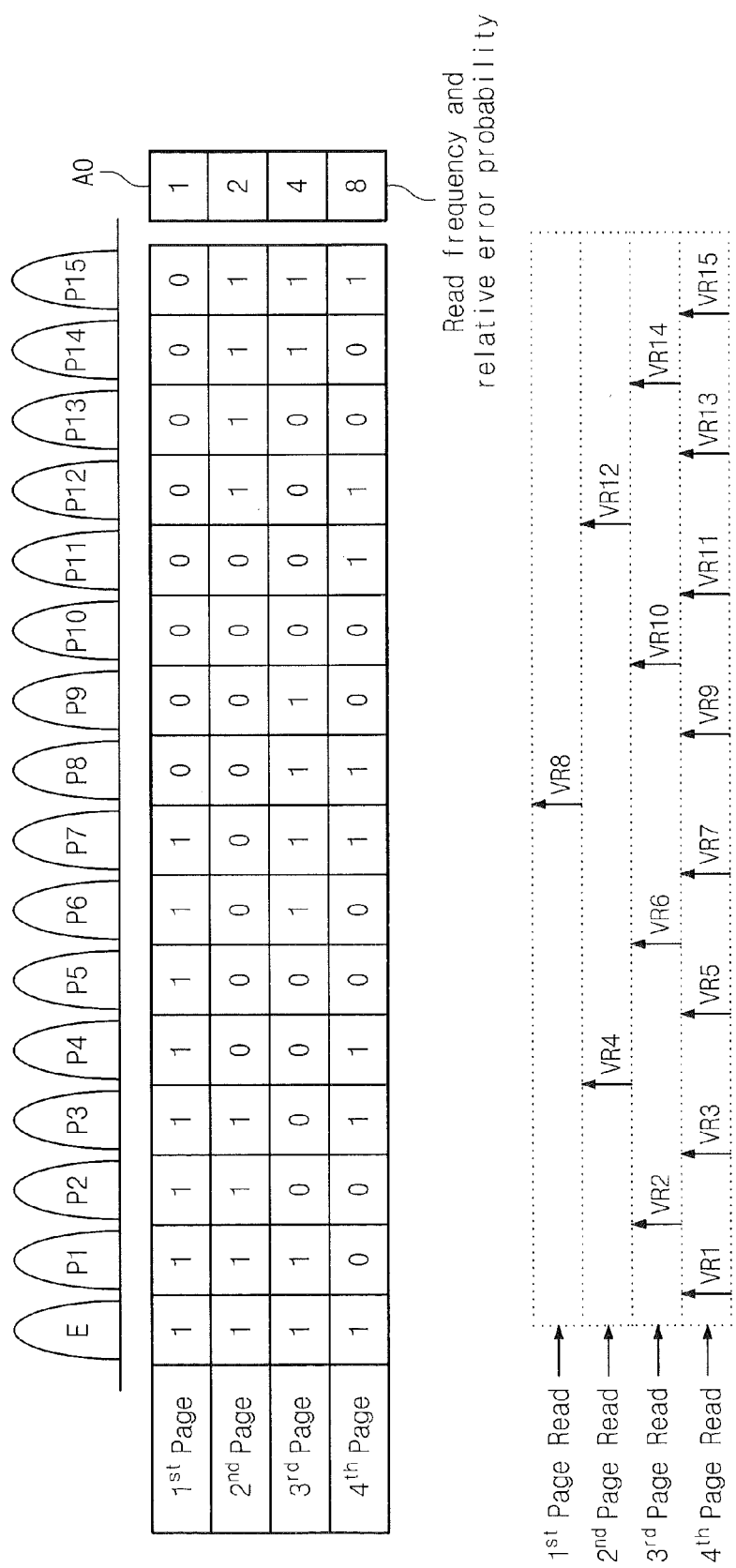

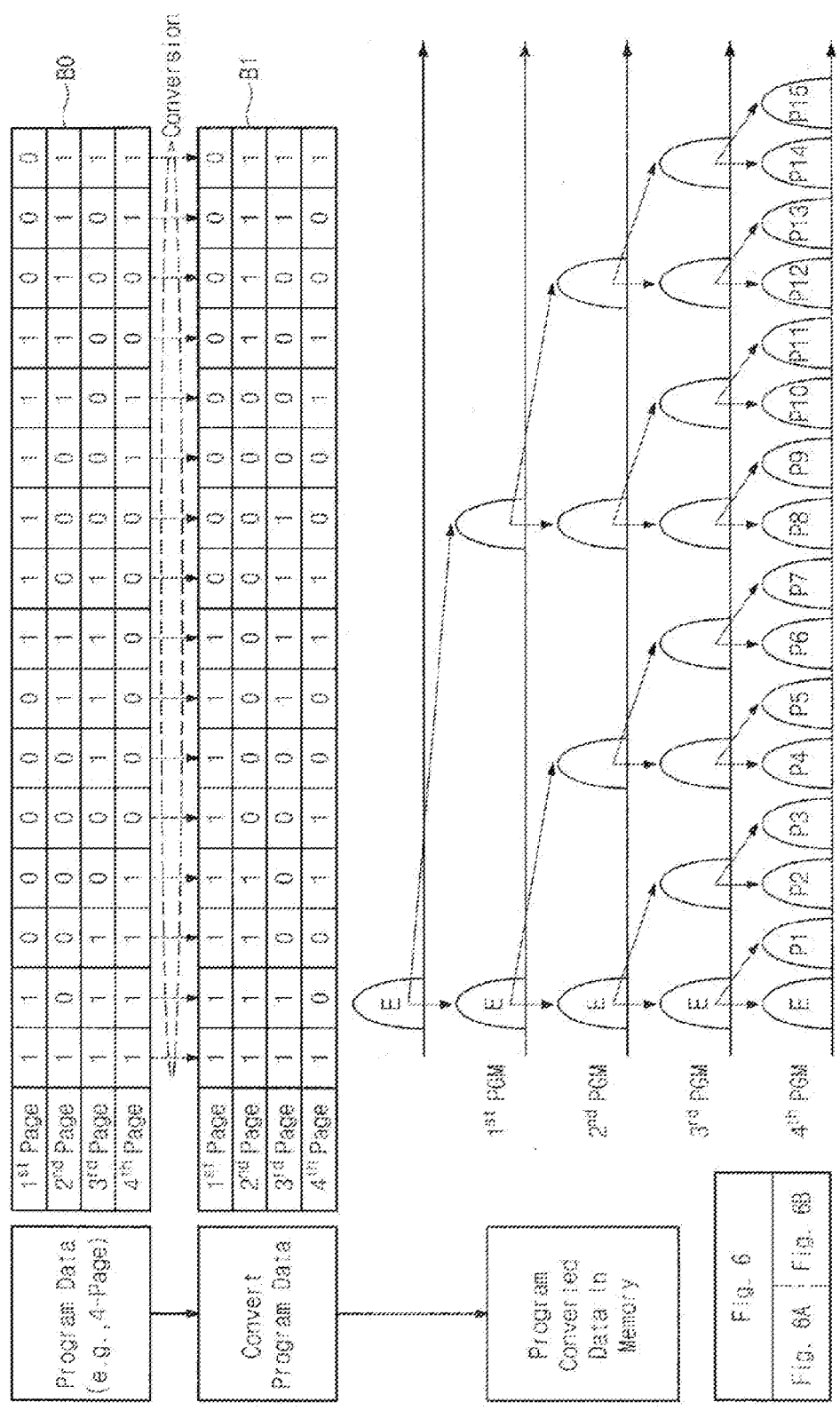

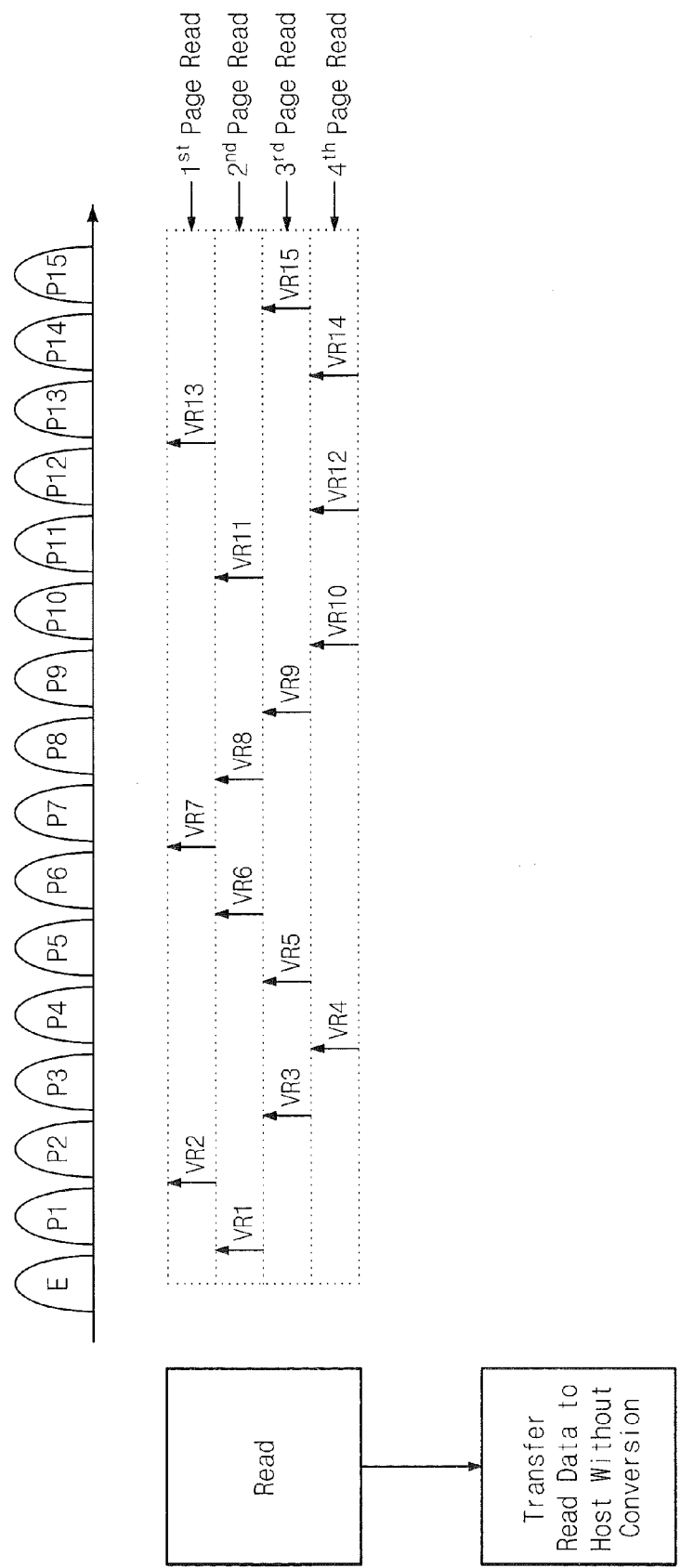

US 8,743,604 B2

NONVOLATILE MEMORY DEVICES HAVING IMPROVED READ RELIABILITY

REFERENCE TO PRIORITY APPLICATION

This application claims priority to Korean Patent Application No. 10-2010-0011553, filed Feb. 8, 2010, the contents of which are hereby incorporated herein by reference.

FIELD

The present invention relates to semiconductor memory devices and, more particularly, to non-volatile memory devices storing multi-bit data.

BACKGROUND

Generally, semiconductor memory devices are the most essential microelectronic elements for digital logic designs such as computers and applications based on microprocessors pertaining to a range from satellites to consumer electronic technologies. Therefore, the advancements of technologies of fabricating semiconductor memories, including process improvement and technology development obtained through scaling for higher integration and speed, contribute to establishment of performance standards of other digital logics.

Semiconductor memory devices are generally classified into volatile memory devices and nonvolatile memory devices. In the volatile memory devices, logic information is stored by establishing the logic state of a flip-flop in case of a static random access memory and charging a capacitor in case of a dynamic random access memory. In the volatile memory devices, data is stored and read while power is supplied, whereas data is lost when power is shut off.

In the nonvolatile memory devices such as MROM, PROM, EPROM, EEPROM, and PRAM, data is retained even when power is shut off. The data storage state of the nonvolatile memory devices is permanent or reprogrammable according to applied fabrication technologies. The nonvolatile memory devices are used to store programs and microcodes in various applications such as computers, avionics, communications, and consumer electronic technologies. A combination of volatile and nonvolatile memory storage modes in a single chip may also be used in devices such as nonvolatile RAMs (nvRAMs) in a system that requires quick and reprogrammable nonvolatile memories. In addition, specific memory structures including some additional logic circuits have been developed to optimize the performance for application-oriented tasks.

In the nonvolatile semiconductor memory devices, it is not easy for general users to renew stored contents because MROM, PROM, and EPROM are not free to erase and write. However, since nonvolatile semiconductor memory devices such as EEPROM and PRAM are possible to electrically erase and write, their applications are being expanded to auxiliary memory units or system programming that requires continuous renewal.

SUMMARY

Memory systems according to embodiments of the invention include at least one nonvolatile memory array having a plurality of rows of nonvolatile multi-bit (e.g., N-bit, where N>2) memory cells therein. A control circuit is also provided. The control circuit, which is electrically coupled to the nonvolatile memory array, is configured to program at least two pages of data into a first row of nonvolatile multi-bit memory cells in the nonvolatile memory array using a first sequence of read voltages to verify accuracy of the data stored within the first row. The control circuit is also configured to read the at least two pages of data from the first row using a second sequence of read voltages that is different from the first sequence of read voltages. According to some of these embodiments of the invention, each of the read voltages in the first sequence of read voltages is equivalent in magnitude to a corresponding read voltage in the second sequence of read voltages.

According to additional embodiments of the invention, the control circuit is configured to program the at least two pages of data into the first row by (i) converting at least two pages of write data into at least two pages of converted data having different binary values relative to the at least two pages of write data; and (ii) adjusting threshold voltages of the nonvolatile multi-bit memory cells in the first row to correspond to the at least two pages of converted data. This control circuit is also configured to read the at least two pages of converted data from the first row as the at least two pages of write data.

Methods of operating nonvolatile memory devices according to embodiments of the invention include programming a row of N-bit memory cells in the nonvolatile memory device with at least three pages of data using a first sequence of read voltages to verify accuracy of the at least three pages of data, and then reading the row of N-bit memory cells containing the at least three pages of data using a second sequence of read voltages that is different from the first sequence of read voltages. In particular, these methods may include converting four pages of write data into four pages of converted data having different binary values relative to the four pages of write data. In addition, the programming may include programming the row of N-bit memory cells in the nonvolatile memory device with the four pages of converted data using the first sequence of read voltages to verify accuracy of the four pages of converted data. The reading may also include reading the row of N-bit memory cells containing the four pages of converted data as the four pages of write data.

According to additional embodiments of the invention, methods of operating nonvolatile memory devices having N-bit memory cells therein may include converting at least three pages of write data into at least three pages of converted data having different binary values relative to the at least three pages of write data, and programming a row of N-bit memory cells in the nonvolatile memory device with the at least three pages of converted data using a first sequence of read voltages to verify accuracy of the at least three pages of converted data stored within the row of N-bit memory cells. An operation may also be performed to read the row of N-bit memory cells containing the at least three pages of converted data as the at least three pages of write data, using a second sequence of read voltages that is different from the first sequence of read voltages.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 1A and 1B are diagrams illustrating the ordering of bit patterns according to an exemplary embodiment;

FIG. 6A and 6B illustrate an operation of a memory system according to an exemplary embodiment of the inventive concept;

DETAILED DESCRIPTION OF THE EMBODIMENTS

Figure 1B:
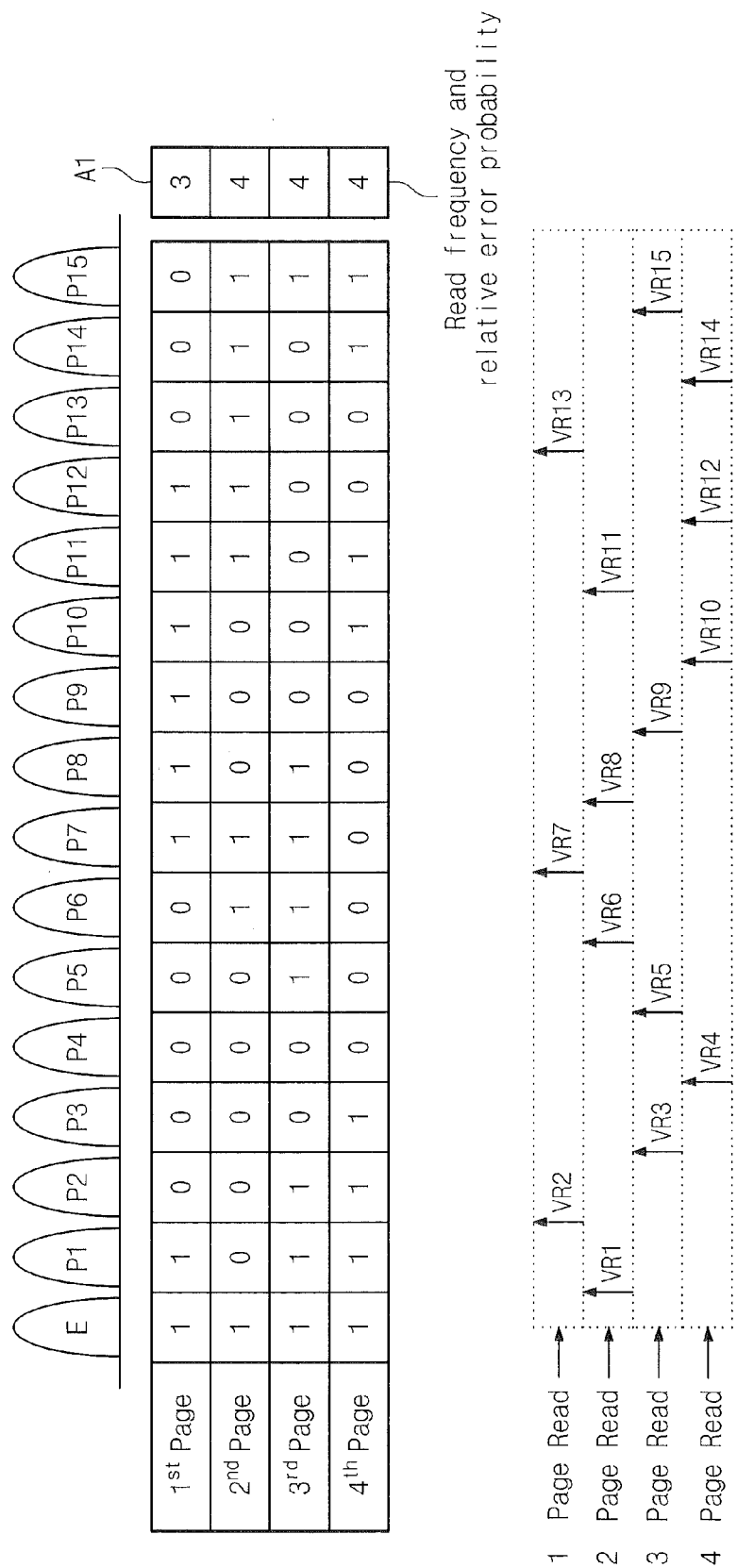

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, exemplary embodiments of the inventive concept are exaggerated for clarity of illustration and are not limited to illustrated specific shapes. Throughout the specification and drawings, like reference numerals denote like elements.

As used herein, the term "and/or" includes any and all combinations of one or more of the associated listed items. Also, when one part (or element, device, etc.) is referred to as being "connected/coupled" to another part (or element, device, etc.), it should be understood that the former may be "directly connected" to the latter, or "indirectly connected" to the latter through at least one intervening part (or element, device, etc.). The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components.

Developments of multi-level data storage technologies have been accelerated to improve price competitiveness. For example, the number of data bits stored in a memory cell is increasing. As the number of data bits stored in a memory cell increases, various limitations such as coupling, error rate, program frequency, and read frequency are being anticipated. It becomes important to determine the ordering of bit patterns that may minimize the above limitations. The ordering of bit patterns may also be called a bit allocation manner. Here, the bit pattern may refer to a line of bits stored in one memory cell. For example, when 4-bit data is stored in one memory cell, the bit pattern may have one of values existing between "0000" and "1111", and the ordering of bit patterns, i.e., the bit allocation manner may be variously configured according to the number of the data bits stored in the memory cell. The orderings of bit patterns (i.e., bit allocation manners) according to an exemplary embodiment are shown in FIGS. 1A and 1B.

The bit patterns shown in FIGS. 1A and 1B may correspond to a case where 4-bit data is stored in a memory cell. In this case, 4-page data are stored memory cells of a selected word line, respectively. The respective memory cells may be programmed to have one of an erased state E and program states P1 to P15. For example, referring to FIG. 1A, when a memory cell has the erased state E, data "1111" may be stored in the memory cell. When a memory cell has the program state P1, data "0111" may be stored in the memory cell. That is, the data states E and P1 to P15 may be allocated to have corresponding bit patterns. The respective bit patterns corresponding to the data states E and P1 to P15 may be allocated as shown in FIG. 1B. For example, when a memory cell has the erased state E, the data "1111" may be stored in the memory cell. When a memory cell has the program state P1, data "1101" may be stored in the memory cell. In an exemplary embodiment, the orderings of the bit patterns are not limited to those shown in FIGS. 1A and 1B.

A read operation of data stored in a memory cell may be a process of determining whether a threshold voltage of the memory cell corresponds to any state and obtaining corresponding 4-bit data according to the determination result. The read operation may be performed by a page unit and may be performed to find whether data of respective memory cells in respective pages are '0' or '1' by checking whether the threshold voltage of the memory cell is higher or lower than a state boundary by which data are divided into '0' or '1'.

For example, when the memory cells are programmed to have the ordering of bit patterns shown in FIG. 1A, the first page data may be read by performing the read operation once using a read voltage VR8 corresponding to a state boundary between the states P7 and P8. The second page data may be read by performing the read operation twice using read voltages VR4 and VR12 corresponding to a state boundary between the states P3 and P4 and a state boundary between the states P11 and P12, respectively. The third page data may be read by performing the read operation four times using read voltages VR2, VR6, VR10 and VR14 corresponding to a state boundary between the states P1 and P2, a state boundary between the states P5 and P6, a state boundary between the states P9 and P10, and a state boundary between the state P13 and P14, respectively. Fourth page data may be read by performing the read operation eight times, using read voltages VR1, VR3, VR5, VR7, VR9, VR11, VR13 and VR15 corresponding to a state boundary between the states E1 and P1, a state boundary between the states P2 and P3, a state boundary between the states P4 and P5, a state boundary between the state P6 and P7, a state boundary between the states P8 and P9, a state boundary between the states P10 and P11, a state boundary between the states P12 and P13, and a state boundary between the state P14 and P15, respectively.

When the memory cells are programmed to have the ordering of bit patterns shown in FIG. 1B, read voltages may be determined in the same manner as described above. Read operations may be performed using the determined read voltages. For example, the first page data may be read by performing the read operation three times, using the read voltages VR2, VR7 and VR13, and the second page data may be read by performing the read operation four times, using the read voltages VR1, VR6, VR8 and VR11. The third page data may be read by performing the read operation four times, using the read voltages VR3, VR5, VR9 and VR15, and the fourth page data may be read by performing the read operation four times, using the read voltages VR4, VR10, VR12 and VR14.

Multi-bit data programmed according to a determined ordering of bit patterns may be read by a read method corresponding to the determined ordering of bit patterns. That is, a method for programming multi-bit data according to the ordering of bit patterns may correspond to one read method. For example, multi-bit data stored according to the ordering of bit pattern shown in FIG. 1A may be read in the read method described in FIG. 1A. If the multi-bit data stored according to the ordering of bit patterns shown in FIG. 1A is read by the read method described in FIG. 1B, data different from the stored data may be read. Accordingly, when the ordering of bit patterns is determined, a program method and a read method corresponding to the determined ordering of bit patterns may be determined. This means that, when the multi-bit data is stored according to the program method corresponding to the determined ordering of bit patterns, the multi-bit data may be read according to the read method corresponding to the program method (or corresponding to the determined ordering of bit patterns).

When data are programmed according to the orderings of the bit patterns shown in FIGS. 1A and 1B, the error probability generated when the first to fourth page data are respectively read may correspond to the read frequency, as respectively shown in the boxes A0 and A1 at the right side. For example, the ordering of bit patterns shown in FIG. 1A (i.e., the error probability distribution of the bit allocation manner) may be 1:2:4:8, and the error probability distribution of the bit allocation manner may be 3:4:4:4 shown in FIG. 1B. Since the error correction ability of a memory system has to be designed to correct an error of a page having the greatest error probability, a memory system adopting the bit allocation manner shown in FIG. 1A may require an error correction circuit having a relatively greater error correction ability compared to a memory system adopting the bit allocation manner shown in FIG. 1B. The bit allocation manner shown in FIG. 1B may facilitate implementation of uniform error probability distribution (or uniform read latency).

Figure 2A:
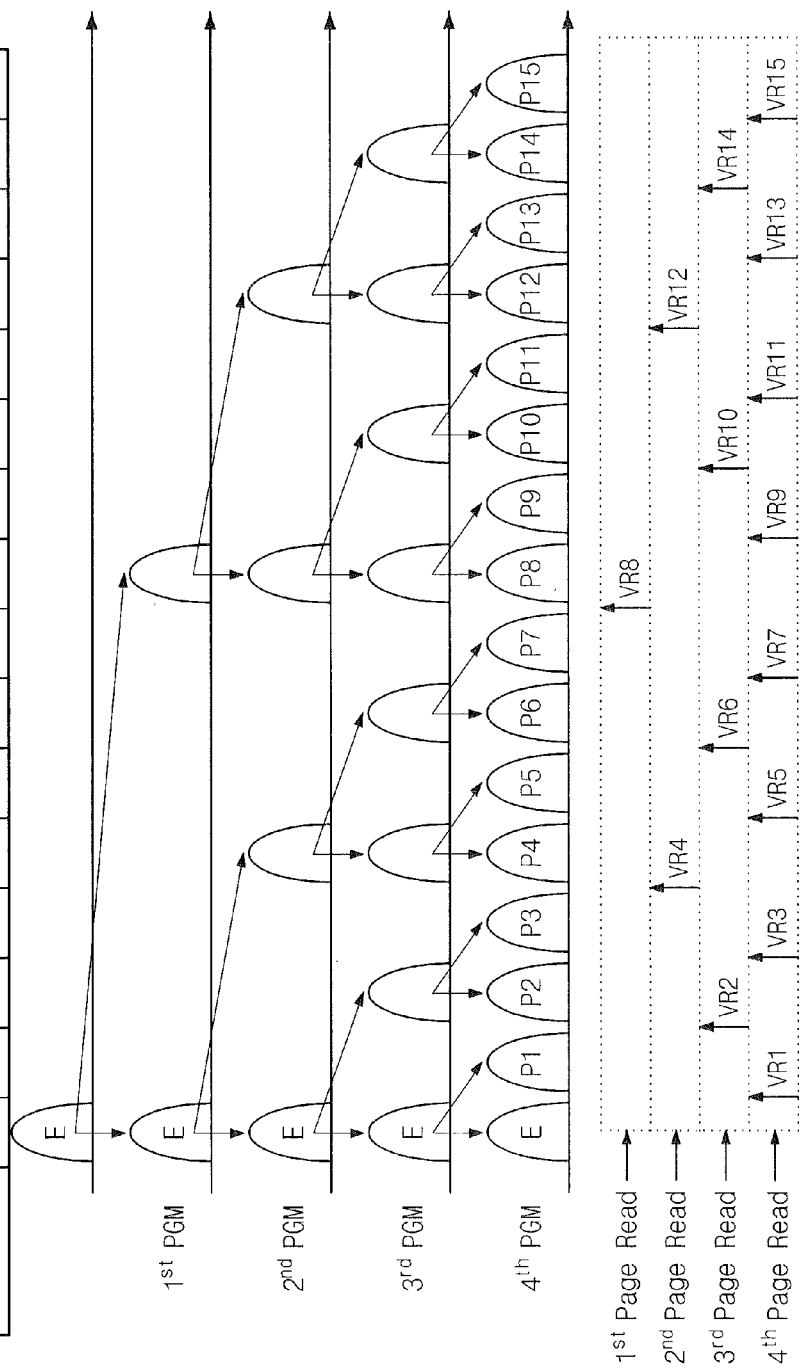
FIG. 2A is a diagram illustrating a program manner according to a bit allocation manner shown in FIG. 1A according to an exemplary embodiment.
Figure 2B:
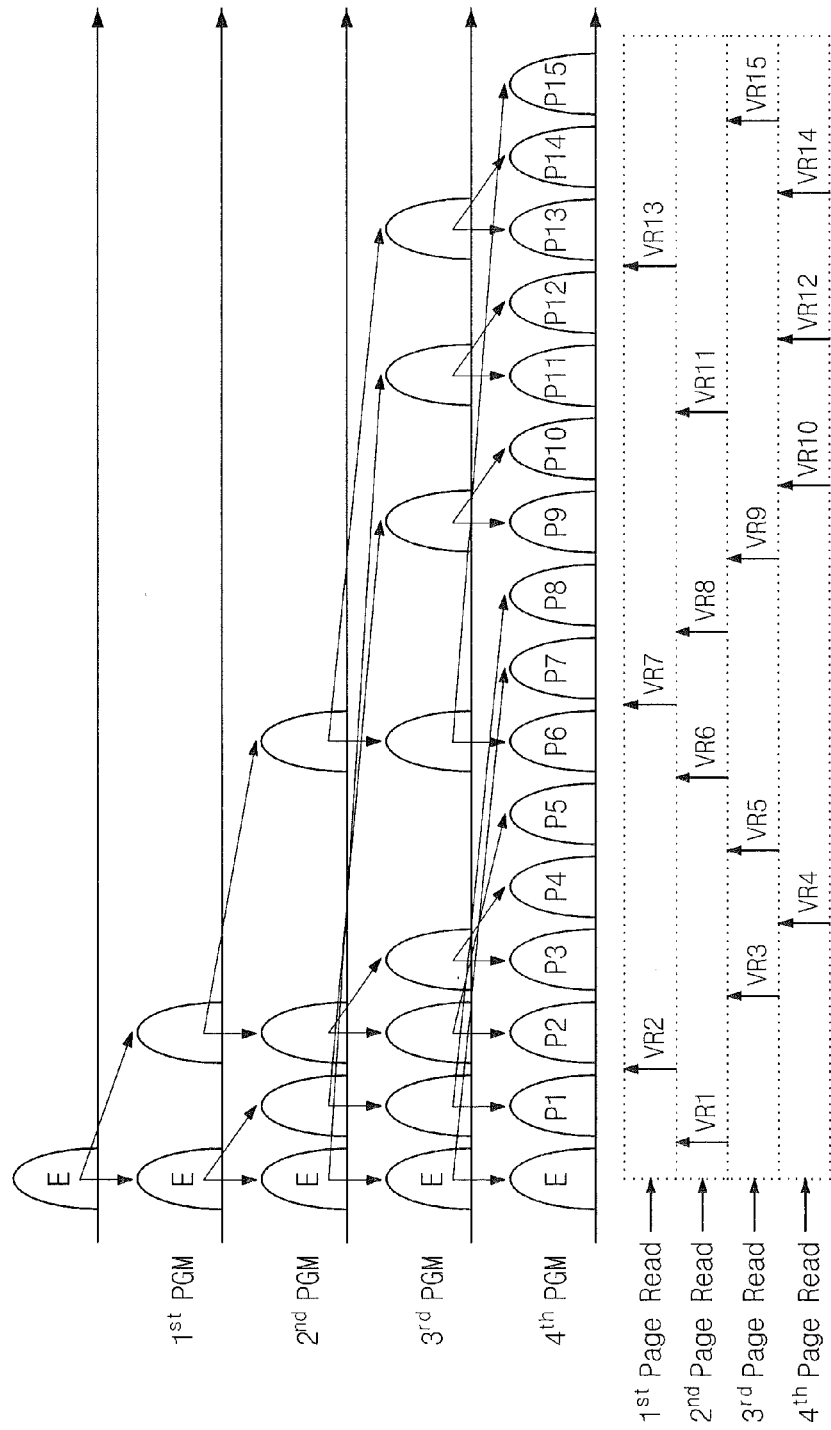
FIG. 2B is a diagram illustrating a program manner according to a bit allocation manner shown in FIG. 1B according to an exemplary embodiment.

FIG. 2A is a diagram illustrating a program manner according to a bit allocation manner shown in FIG. 1A according to an exemplary embodiment. FIG. 2B is a diagram illustrating a program manner by a bit allocation manner shown in FIG. 1B according to an exemplary embodiment. The program manner as shown in FIG. 2A may be suitable to application of various algorithms for compensating for cell distribution deterioration due to inter-cell coupling because the increment of the threshold voltage distribution is uniform in every state. On the contrary, the program manner shown in FIG. 2B may not be suitable to application of various algorithms for improving the threshold voltage distribution of cells because the increment of the threshold voltage distribution is not uniform in every state.

As seen from the above description, it is difficult to determine a bit allocation manner suitable to application of various algorithms for improvement of the threshold voltage distribution as well as implementation of uniform error probability distribution. A memory system according to an exemplary embodiment of the inventive concept may implement uniform error probability distribution, and may use program and read manners suitable to application of various algorithms for improvement of the threshold voltage distribution, which will be described in detail below.

Figure 3:
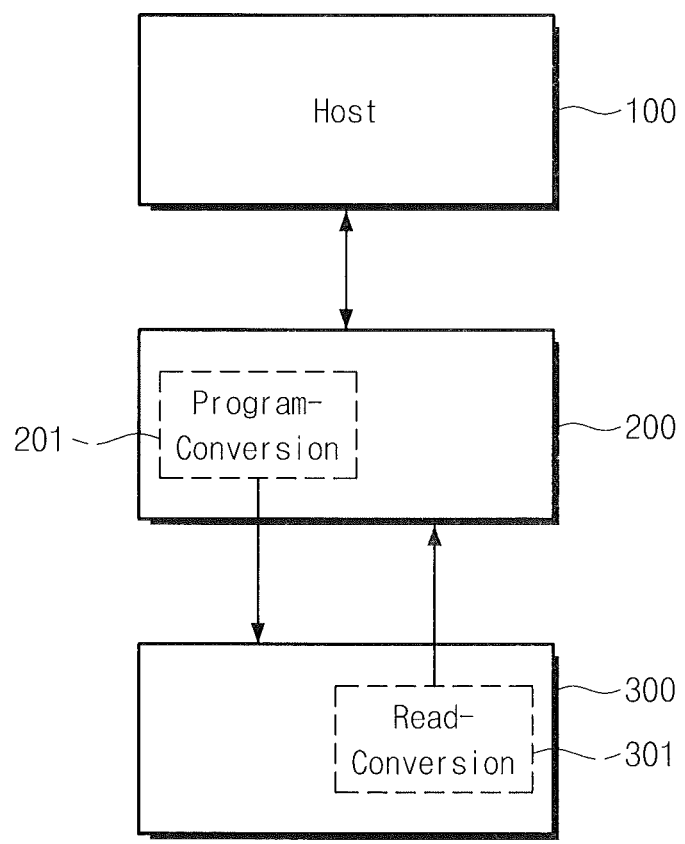
FIG. 3 is a block diagram illustrating a memory system according to an exemplary embodiment of the inventive concept.

FIG. 3 is a block diagram illustrating a memory system according to an exemplary embodiment of the inventive concept. Referring to FIG. 3, the memory system may use a non-volatile memory device as the storage media. The memory system may include a host 100, a controller 200, and a non-volatile memory device 300. The controller 200 may control the non-volatile memory device 300 in response to the host 100. The controller 200 may convert data provided from the host 100 such that the data have the ordering of bit patterns suitable to application of various algorithms for improvement of the threshold voltage distribution. The converted data may be stored in the non-volatile memory device 300. For example, the controller 200 may include a data converter 201. The data converter 201 may be configured to convert data to be stored in the non-volatile memory device 300. In an exemplary embodiment, the data converter 201 may not convert data read from the non-volatile memory device 300. That is, the data read from the non-volatile memory device 300 may be sent to the host 100 without data conversion. The data conversion may be variously implemented. The data conversion may be performed after all page data to be stored in memory cells of a selected word line are temporarily stored in the controller (e.g., buffer memory) 200.

For example, it will be assumed that the respective bit patterns corresponding to the states E and P1 to P15 are allocated as shown in FIG. 1B and program operations are performed as shown in FIG. 2A. Here, the allocation of the bit patterns may relate to data transmitted from the host 100 before data conversion. According to the above assumption, the first to fourth page data may be temporarily stored in the controller 200 (e.g., buffer memory of the controller 200). The data converter 201 of the controller 200 may convert the temporarily-stored data such that the data have the bit patterns as shown in FIG. 1A. The converted data may be stored in the non-volatile memory device 300 according to the program manner shown in FIG. 2A. For example, the input data corresponding to the P1 state may be converted from "1101" to "0111", and the input data corresponding to the P2 state may be converted from "1100" to "0011". The input data corresponding to the P3 state may be converted from "1000" to "1011". That is, the data "1101" (corresponding to the state P1) requested to be written by the host 100 may be converted into "0111" by the data converter 201 of the controller 200, and the converted data "0111" may be stored in the non-volatile memory device 300. Here, it will be understood that the data conversion is not limited to the contents disclosed herein.

The non-volatile memory device 300 may be configured to perform the program/read operations in response to the request of the controller 200. The non-volatile memory device 300 may be configured such that transmitted data are programmed according to the program manner (i.e., program manner corresponding to the ordering of bit patterns of the converted data) shown in FIG. 2A. The non-volatile memory device 300 may perform the read operation such that the data (i.e., data transmitted from the host 100 before the data conversion) write-requested by the host 100 are read. As the data (i.e., data transmitted from the host 100 before the data conversion) write-requested by the host 100 are read, the read data may be directly sent to the host 100 without a conversion operation of the controller 200. That is, the non-volatile memory device 300 may be configured to perform the program operation according to the bit allocation manner shown in FIG. 1A and perform the read operation according to the bit allocation manner shown in FIG. 1B, which will be described in detail below.

Figure 4:
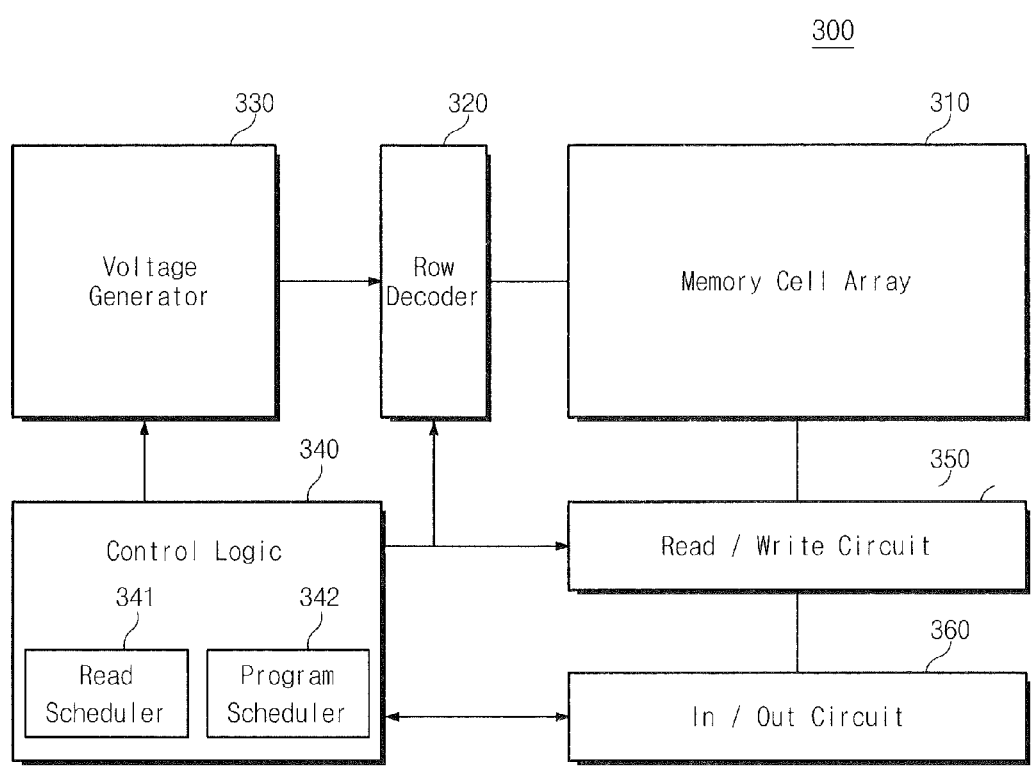
FIG. 4 is a block diagram illustrating a non-volatile memory device shown in FIG. 3 according to an exemplary embodiment of the inventive concept.

FIG. 4 is a block diagram illustrating a non-volatile memory device shown in FIG. 3 according to an exemplary embodiment of the inventive concept. Referring to FIG. 4, the non-volatile memory device may be a NAND flash memory device, but embodiments of the inventive concept are not limited thereto. For example, it will be understood that embodiments of the inventive concept may be applied to MROM, PROM, FRAM, NOR-type flash memory devices, and the like. The non-volatile memory device 300 may include a memory cell array 310 having memory cells arranged in rows (word lines: WL) and columns (bit lines: BL). The respective memory cells may store 1-bit data or M-bit (multi-bit) data (M is an integer greater than 1). The respective memory cells may be implemented with a memory cell having a charge storage layer such as a charge trap layer or a floating gate, a memory cell having a variable resistor, or the like. The memory cell array 310 may be implemented to have a well-known single-layer array structure (referred to as two-dimensional array structure) or multi-layer array structure (referred to as three-dimensional array structure). An exemplary three-dimensional array structure is disclosed in U.S. Pat. Pub. No. 2008/0023747 entitled "SEMICONDUCTOR MEMORY DEVICE WITH MEMORY CELLS ON MULTIPLE LAYERS" and U.S. Pat. Pub. No. 2008/0084729 entitled "SEMICONDUCTOR DEVICE WITH THREE-DIMENSIONAL ARRAY STRUCTURE", the entire contents of which are hereby incorporated by reference.

A row decoder 320 may be configured to perform selection and driving of the rows of the memory cell array 310. A voltage generator 330 may be controlled by a control logic 340, and may be configured to generate voltages (e.g., program voltage, pass voltage, erase voltage, and read voltage) necessary for the program, erase, and read operations. The read/write circuit 350 may be controlled by the control logic 340, and may operate as a detection amplifier or a write driver according to the operation mode. For example, during the read operation, the read/write circuit 350 may operate as a sense amplifier for detecting data from memory cells (or selected memory cells) of a selected row. The read data may be provided to the outside through the input/output circuit 360 by a predetermined input/output unit. During the program operation, the read/write circuit 350 may operate as a write driver for driving the memory cells of a row selected according to program data. The read/write circuit 350 may include page buffers each corresponding to respective bit lines or bit line pairs. When the respective memory cells store multi-bit/multi-level data, the respective page buffers of the read/write circuit 350 may be configured to have two or more latches. The input/output circuit 360 may be configured to interface with external devices (e.g., memory controller or host)

The control logic 340 may include a read scheduler 341 configured to control the read operation and a program scheduler 342 configured to control the program operation. The read scheduler 341 may control the read operation according to the read manner (e.g., read manner shown in FIG. 1B) corresponding to the bit allocation manner related to the data transmitted from the host 100 before the data conversion. That is, the read scheduler 341 may be configured to perform the read operation corresponding to the bit allocation manner having uniform error probability distribution. The program scheduler 342 may control the program operation according to the program manner (e.g., program manner shown in FIG. 2A) corresponding to the bit allocation manner related to the converted data. That is, the program scheduler 342 may be configured to perform the program operation suitable to application of various algorithms for compensating for cell distribution deterioration.

In an exemplary embodiment, the read scheduler 341 may be configured to be programmable by an external device (e.g., controller). For example, the read algorithm of the read scheduler 341 may be programmable through setting of a register set by the controller 200 upon power-up. The program scheduler 342 may be configured to be programmable in a similar way to the read scheduler 341. On the contrary, the read and program algorithms of the read and program schedulers 341 and 342 may be fixed in hardware.

Figure 5:
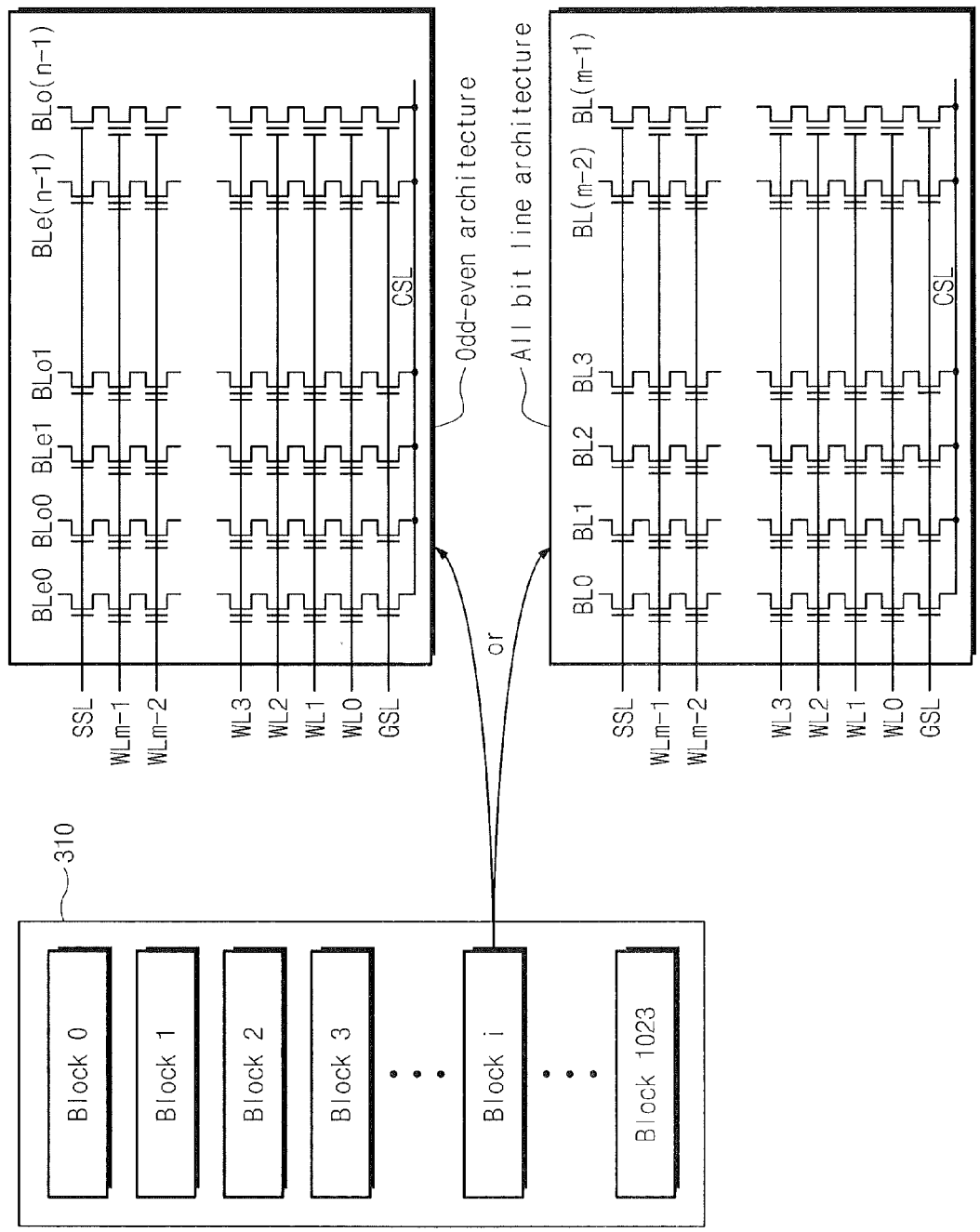
FIG. 5 is a diagram illustrating a memory cell array configured with memory blocks for an all bit line memory architecture or an odd-even memory architecture.

FIG. 5 is a diagram illustrating a memory cell array 310 configured with memory blocks for an all bit line memory architecture or an odd-even memory architecture. Hereinafter, an exemplary architecture of the memory cell array 310 will be described in detail. As an example, a NAND flash memory device having a memory cell array 310 including 1024 memory blocks will be described. Data stored in the respective memory blocks may be simultaneously erased. In an exemplary embodiment, the memory block may be the minimum unit of storage devices that may be simultaneously erased. For example, the memory block may include a plurality of columns corresponding to the bit lines (e.g., bit lines of 1 KB). In an exemplary embodiment of the all bit line (ABL) architecture, all bit lines of the memory block may be simultaneously selected during the read and program operations. The storage devices pertaining to a common word line and connected to all bit lines may be simultaneously programmed.

In an exemplary embodiment, the plurality of storage devices in the same column may be connected to each other in series to form a NAND string. One terminal of the NAND string may be connected to a corresponding bit line through a select transistor controller by the string select line SSL, and the other terminal of the NAND string may be connected to a common source line CSL through a select transistor controlled by a ground select line GSL. In another exemplary embodiment of the odd-even bit line architecture, the bit lines may be divided into even bit lines BLe and odd bit lines BLo. In the odd-even bit line architecture, storage devices in a common word line and connected to the odd bit lines may be programmed at a first time, whereas storage device pertaining to a common word line and connected to the even bit lines may be programmed at a second time. Data may be programmed in other blocks, and may be read from other memory blocks. This operation may be simultaneously performed.

FIG. 6 is a diagram illustrating an operation of a memory system according to an exemplary embodiment of the inventive concept. Hereinafter, an operation of a memory system according to an exemplary embodiment of the inventive concept will be described in detail with reference to the accompanying drawings. For the purpose of explanation, it will be assumed that 4-bit data (or 16-level data) are stored in memory cells of a non-volatile memory device 300.

When read/program operations are requested from the host 100, the controller 200 may temporarily store program data provided from the host 100. The program data provided from the host 100 may not be directly sent to the non-volatile memory device 300 by the controller 200. For data conversion, the controller 200 may wait until 4-page data to be stored in memory cells of a selected word line are gathered. Once 4-page data are gathered, the data converter 201 of the controller 200 may convert 4-page data temporarily stored in a buffer memory (not shown) to suit the data to application of various algorithm for compensating for cell distribution deterioration. For example, when a pattern of fourth to first page data bits is "1101" corresponding to a P1 state, the bit pattern "1101" may be converted to the bit pattern "0111". When a pattern of fourth to first page data bits is "1100" corresponding to a P2 state, the bit pattern "1100" may be converted to the bit pattern "0011". Bit patterns corresponding to other states may also be converted in the same way as described above. Although the program data are converted, the state to be programmed may not be changed. That is, when the data corresponding to the P1 state is inputted, the converted bit pattern may also correspond to the P1 state.

The converted data may be sent to the non-volatile memory device 300. The program scheduler 342 of the non-volatile memory device 300 may program the converted data in the memory cells of the selected word line. The memory cells of the selected word line may be programmed according to the program manner shown in FIG. 2A corresponding to the ordering of bit patterns of the converted data as shown in FIG. 6. Such a program manner may be suitable to application of various algorithms for improvement of the threshold voltage distribution. Once 4-page data are programmed in the memory cells of the selected word line, the program procedure may go to end.

Thereafter, the data stored in the memory cells of the selected word line are requested from the host 100, the non-volatile memory device 300 may read the data requested to be read from the memory cells of the word line, and may sent the read data to the controller 200. The controller 200 may send the read data to the host 100 directly without a conversion process, which will be described in detail below.

When the first page data stored in the memory cells of the selected word line is requested from the host 100, the non-volatile memory device 300 may read the first page data by performing a read operation three times by using the read voltages VR2, VR7 and VR13, not the read voltage VR8. The read page data may be data (corresponding to the first page data of the box BO of FIG. 6) transmitted from the host 100 before the data conversion. When the second page data stored in the memory cells of the selected word line is requested from the host 100, the non-volatile memory device 300 may read the second page data by performing a read operation four times by using the read voltages VR1, VR6, VR8 and VR11, not the read voltages VR4 and VR12. The read page data may be data (corresponding to the second page data of the box BO of FIG. 6) transmitted from the host 100 before the data conversion. When the third page data stored in the memory cells of the selected word line is requested from the host 100, the non-volatile memory device 300 may read the third page data by performing a read operation four times by using the read voltages VR3, VR5, VR9 and VR15, not the read voltages VR2, VR6, VR10 and VR14. The read page data may be data (corresponding to the third page data of the box BO of FIG. 6) transmitted from the host 100 before the data conversion. When the fourth page data stored in the memory cells of the selected word line is requested from the host 100, the non-volatile memory device 300 may read the fourth page data by performing a read operation four times by using the read voltages VR4, VR10, VR12 and VR14, not the read voltages VR1, VR3, . . . , VR13 and VR15. The read page data may be data (corresponding to the fourth page data of the box BO of FIG. 6) transmitted from the host 100 before the data conversion.

As seen from the above description, the controller 200 may convert data such that the data have the ordering of bit patterns suitable to application of various algorithms for improvement of the threshold voltage distribution. The converted data may be stored in the non-volatile memory device 300. The non-volatile memory device 300 may read data according to the ordering of bit patterns suitable to implementation of uniform error probability distribution. The read data may be sent to the host 100 through the controller 200 without a data conversion process. The ordering of bit patterns corresponding to the read operation may be different from the ordering of bit patterns corresponding to the program operation. That is, the program data sent to the non-volatile memory device 300 may be different from the read data sent from the non-volatile memory device 300. For example, embodiments of the invention include at least one nonvolatile memory array 310 having a plurality of rows of nonvolatile multi-bit (e.g., N-bit, where N>2) memory cells therein. (See, e.g., FIGS. 4-5). A control circuit is also provided. The control circuit according to some embodiments of the invention may include a control logic circuit 340 and other components such as a voltage generator 330, a row decoder 320, a read/write circuit 350 and an input/output circuit 360, as illustrated by FIG. 4. The control circuit, which is electrically coupled to the nonvolatile memory array 310, is configured to program four pages of data into a row of nonvolatile multi-bit memory cells in the nonvolatile memory array 310 using a first sequence of read voltages (e.g., VR8, VR4, VR12, VR2, VR6, VR10, VR14, VR1, VR3, VR5, VR7, VR9, VR11, VR13 and VR15) to verify accuracy of the data stored within the row being programmed. (See, e.g., FIGS. 2, 6A). The control circuit is also configured to read the four pages of data from the row using a second sequence of read voltages that is different from the first sequence of read voltages. As illustrated by FIG. 6B, the second sequence of read voltages may be the following sequence: VR2, VR7, VR13, VR1, VR6, VR8, VR11, VR3, VR5, VR9, VR15, VR4, VR10, VR12 and VR14. As illustrated by FIG. 6A, the control circuit may be configured to program the four pages of data into the row being programmed by (i) converting at least two pages of write data into at least two pages of converted data having different binary values relative to the at least two pages of write data; and (ii) adjusting threshold voltages of the nonvolatile multi-bit memory cells in the row to correspond to the at least two pages of converted data. As illustrated by FIGS. 1B and 6B, the control circuit is further configured to read the four pages of converted data from the row as the original four pages of write data.

When a program operation is performed at a factory in an application in which a non-volatile memory device is used like ROM, a buffer load of a controller may be removed by converting data in advance to program the converted data in the non-volatile memory device. In this case, the data conversion may be performed according to the program manner corresponding to the ordering of bit patterns of FIG. 1A described above, and the data program may be performed according to the read manner corresponding to the bit patterns of FIG. 1B described above.

Figure 7:
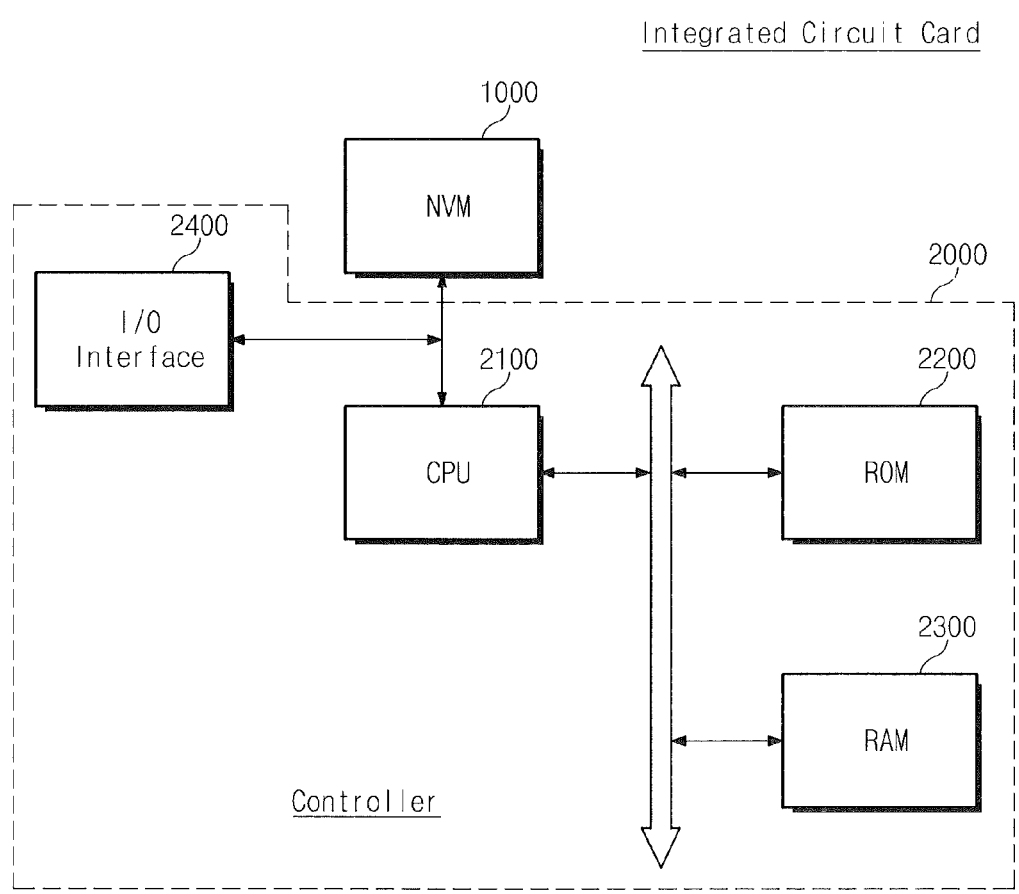
FIG. 7 is a block diagram illustrating an integrated circuit card including a non-volatile memory device according to an exemplary embodiment of the inventive concept.

FIG. 7 is a block diagram illustrating an integrated circuit card including a non-volatile memory device according to an exemplary embodiment of the inventive concept. Referring to FIG. 7, the integrated circuit card (e.g., smart card) may include a non-volatile memory device 100 and a controller 2000. The non-volatile memory device 1000 may be the substantially same as that of FIG. 4, detailed description of which will be omitted herein. The controller 2000 may be the substantially same as that of FIG. 3, detailed description of which will be omitted herein. The controller 2000 may control the non-volatile memory device 1000, and may include a CPU 2100, a ROM 2200, a RAM 2300, and an input/output interface 2400. The CPU 2100 may control overall operations of the integrated circuit card based on various programs stored in ROM 2200. The input/output interface 2400 may provide interfaces with external devices.

The flash memory devices are non-volatile memory devices that can retain stored data even when power is shut off. With an increase of the use of mobile devices such as cellular phones, Personal Digital Assistants (PDAs), digital cameras, portable game consoles, and MP3s, the flash memory devices are more widely used as code storages as well as data storages. The flash memory devices may be used for home applications such as HDTVs, DVDs, routers, and Global Positioning Systems (GPS). A computing system including a non-volatile memory device according to an exemplary embodiment of the inventive concept is schematically illustrated in FIG. 8.

The computing system may include a microprocessor 3100 electrically connected to a bus 3001, a user interface 3200, a modem 3300 such as a baseband chipset, a memory controller 3400, and a flash memory device 3500 serving as a storage medium. The flash memory device 3500 may be configured in the substantially same as that of FIG. 4. N-bit data (N is an integer greater than 0) processed or to be processed by the microprocessor 3100 may be stored in the flash memory device 3500 by the memory controller 3400. When the computing system is a mobile device, a battery 3600 may be additionally provided to supply an operating voltage of the computing system. Although not shown in the drawing, it will be apparent to those skilled in the art that the computing system may further include an application chipset, a Camera Image Processor (CIS), a mobile DRAN, and the like. For example, the memory controller 3400 and the flash memory device 3500 may form a Solid State Drive/Disk (SSD) that uses a non-volatile memory to store data.

Figure 8:
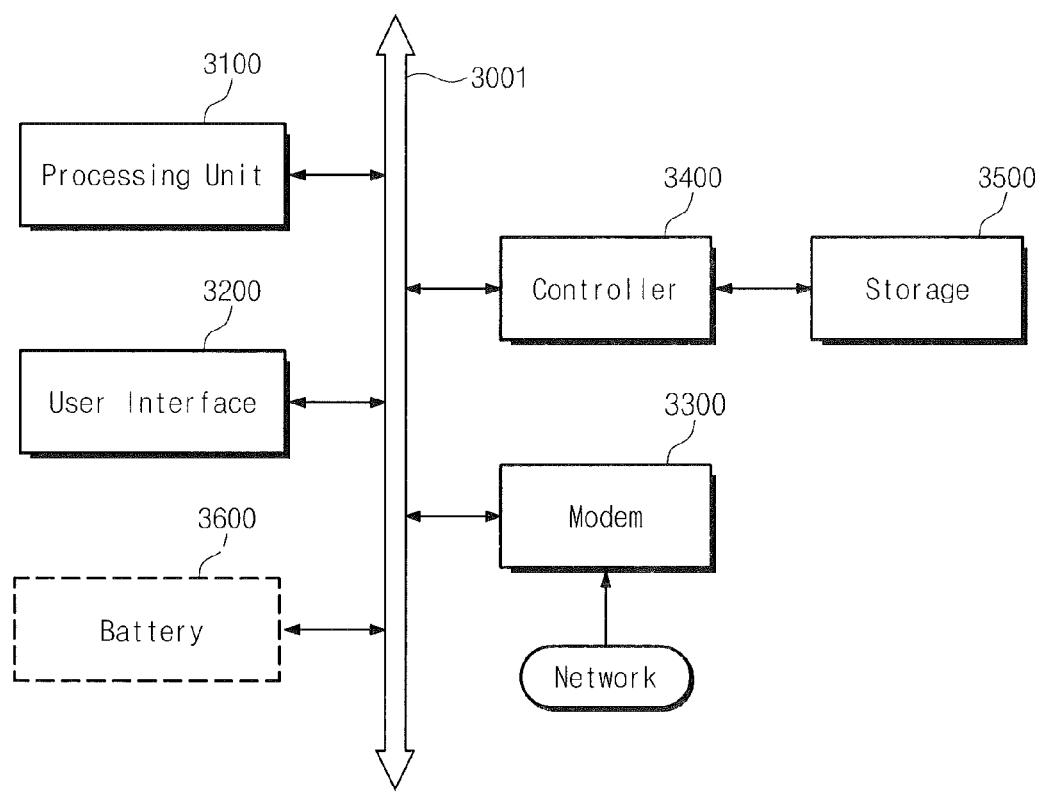
FIG. 8 is a block diagram illustrating a computing system including a non-volatile memory device according to an exemplary embodiment of the inventive concept.
Figure 9:
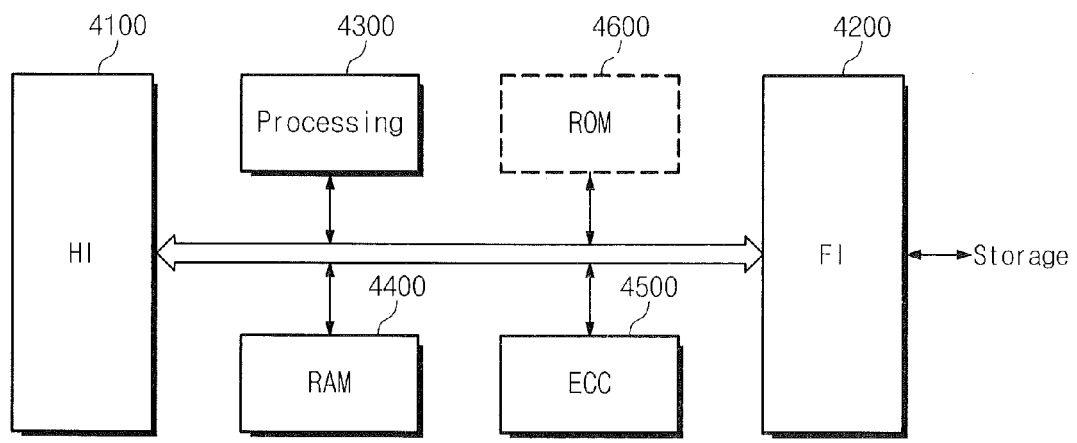
FIG. 9 is a block diagram illustrating a memory controller shown in FIG. 8 according to an exemplary embodiment of the inventive concept.

FIG. 9 is a block diagram illustrating a memory controller shown in FIG. 8 according to an exemplary embodiment of the inventive concept. Referring to FIG. 9, the controller may be configured to store data in a storage medium and read the data from the storage medium. The controller may include a host interface 4100, a memory interface 4200, a processing unit 4300, a buffer memory 4400, and an error control unit 4500. The host interface 4100 may be configured to interface with an external device (e.g., host). The memory interface 4200 may be configured to interface with the storage medium. The processing unit 4300 may be configured to control overall operations of the controller. The buffer memory 4400 may be used to temporarily store data to be stored in the storage medium or data read from the storage medium. Also, the buffer memory 440 may be used as a work memory of the processing unit 4300. The error control unit 4500 may be configured to detect and correct errors of the data read from the storage medium. As shown in FIG. 9, it will be understood that a ROM 4600 may be additionally provided to store code data in the controller.

In an exemplary embodiment of the inventive concept, the memory cells may be configured with variable resistance memory cells. An exemplary variable resistance memory cell and a memory device including the same are disclosed in U.S. Pat. No. 7,529,124, the entire contents of which are hereby incorporated by reference.

In another exemplary embodiment of the inventive concept, memory cells may be implemented using one of various cell structures having a charge storage layer. The cell structure having the charge storage layer may include a charge trap flash structure using a charge trap layer, a stack flash structure with multi-layered arrays, a flash structure without a source-drain, and a pin-type flash structure.

A memory device having a charge trap flash structure as a charge storage layer is disclosed in U.S. Pat. No. 6,858,906, U.S. Patent Publication No. 2004/0169238, and U.S. Patent Publication No. 2006/0180851, the entire contents of which are hereby incorporated by reference. The flash structure without a source/drain is disclosed in Korean Patent No. 10-0673020, the entire contents of which are hereby incorporated by reference.

A flash memory device and/or a memory controller according to an exemplary embodiment of the inventive concept may be mounted using various types of packages. For example, the flash memory device and the memory controller according to an embodiment of the inventive concept may be mounted using packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to exemplary embodiments of the inventive concept, it is possible to adopt the ordering of bit patterns suitable to application of various algorithms for improvement of threshold voltage distribution, and the ordering of bit patterns suitable to implementation of uniform error probability distribution and read latency.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A memory system, comprising:
   a nonvolatile memory array having a plurality of rows of nonvolatile multi-bit memory cells therein; and
   a control circuit electrically coupled to said nonvolatile memory array, said control circuit configured to program at least four pages of data into a first row of nonvolatile multi-bit memory cells in said nonvolatile memory array using a first sequence of read voltages to verify accuracy of the data stored within the first row and further configured to read the at least four pages of data from the first row using a second sequence of read voltages that is different from the first sequence of read voltages,
   wherein said control circuit is configured to program the at least four pages of data into the first row by:
   converting at least four pages of write data into at least four pages of converted data having different binary values relative to the at least four pages of write data; and
   adjusting threshold voltages of the nonvolatile multi-bit memory cells in the first row to correspond to the at least four pages of converted data,
   wherein the second sequence of read voltages includes a sequence of at least four read voltages which have different levels.

2. The memory system of claim 1, wherein each of the read voltages in the first sequence of read voltages is equivalent in magnitude to a corresponding read voltage in the second sequence of read voltages.

3. The memory system of claim 1, wherein said control circuit is configured to read the at least four pages of converted data from the first row as the at least four pages of write data.

4. The memory system of claim 1, wherein the multi-bit memory cells are N-bit memory cells, where N is an integer greater than two.

5. The memory system of claim 1, wherein reading the programmed data of the at least four pages of data from the first row using the first sequence of read voltages causes a first error probability of the read data, and the reading the programmed data of the at least four pages of data from the first row using the second sequence of read voltages causes a second error probability of the read data lower than the first error probability.

6. A method of operating a nonvolatile memory device having N-bit memory cells therein, where N is an integer greater than two, comprising:
- programming a row of N-bit memory cells in the nonvolatile memory device with at least four pages of data using a first sequence of read voltages to verify accuracy of the at least four pages of data; and
- reading the row of N-bit memory cells containing the at least four pages of data using a second sequence of read voltages that is different from the first sequence of read voltages,
- wherein the second sequence of read voltages includes a sequence of at least four read voltages which have different levels.

7. The method of claim 6, further comprising converting four pages of write data into four pages of converted data having different binary values relative to the four pages of write data;
- wherein said programming comprises programming the row of N-bit memory cells in the nonvolatile memory device with the four pages of converted data using the first sequence of read voltages to verify accuracy of the four pages of converted data; and wherein said reading comprises reading the row of N-bit memory cells containing the four pages of converted data as the four pages of write data.

8. A method of operating a nonvolatile memory device having N-bit memory cells therein, where N is an integer greater than two, comprising:
- converting at least four pages of write data into at least four pages of converted data having different binary values relative to the at least four pages of write data;
- programming a row of N-bit memory cells in the nonvolatile memory device with the at least four pages of converted data using a first sequence of read voltages to verify accuracy of the at least four pages of converted data stored within the row of N-bit memory cells; and
- reading the row of N-bit memory cells containing the at least four pages of converted data as the at least four pages of write data, using a second sequence of read voltages that is different from the first sequence of read voltages,
- wherein the second sequence of read voltages includes a sequence of at least four read voltages which have different levels.

9. A memory system comprising:
- a controller configured to convert data based on a first bit pattern ordering using a first sequence of read voltage; and
- a non-volatile memory device configured to program the converted data within a row of N-bit memory cells according to a program method corresponding to the first bit pattern ordering and to read data within the row of N-bit memory cells according to a read method corresponding to a second bit pattern ordering using a second sequence of read voltages wherein the second bit pattern ordering is different from the first bit pattern ordering.

10. The memory system of claim 9, wherein the read data is sent to an external device without conversion by the controller.

11. The memory system of claim 9, wherein the first bit pattern ordering is suitable to application of algorithms for improvement of a threshold voltage distribution, and the second bit pattern ordering is suitable to implementation of uniform error probability distribution and read latency.

12. The memory system of claim 9, wherein the converted data is stored in memory cells of a selected word line and is different from data read from the memory cells of the selected word line.

13. The memory system of claim 9, wherein the non-volatile memory device comprises a read scheduler configured to control the read method corresponding to the second bit pattern ordering, and the read scheduler is programmed by the controller.

14. The memory system of claim 9, wherein the controller comprises:
- a buffer memory configured to store multi-bit data to be stored in memory cells pertaining to a selected word line of the non-volatile memory device; and
- a data converter configured to convert the multi-bit data stored in the buffer memory.

15. The memory system of claim 14, wherein the data converter does not convert data read from the non-volatile memory device.

* * * * *